United States Patent
Markulic et al.

(10) Patent No.: US 10,200,047 B2
(45) Date of Patent: Feb. 5, 2019

(54) DTC-BASED PLL AND METHOD FOR OPERATING THE DTC-BASED PLL

(71) Applicants: IMEC VZW, Leuven (BE); Stichting IMEC Nederland, Eindhoven (NL); Vrije Universiteit Brussel, Brussels (BE)

(72) Inventors: Nereo Markulic, Leuven (BE); Yao-Hong Liu, Eindhoven (NL); Jan Craninckx, Boutersem (BE)

(73) Assignees: IMEC VZW, Leuven (BE); Stichting IMEC Nederland, Eindhoven (NL); Vrije Universiteit Brussel, Brussels (BE)

( * ) Notice: Subject to any disclaimer, the term of this patent is extended or adjusted under 35 U.S.C. 154(b) by 0 days.

(21) Appl. No.: 15/605,261

(22) Filed: May 25, 2017

(65) Prior Publication Data

US 2017/0346493 A1    Nov. 30, 2017

(30) Foreign Application Priority Data

May 25, 2016   (EP) .................................... 16171359

(51) Int. Cl.
  *H03L 7/06*    (2006.01)
  *H03L 7/085*   (2006.01)
  (Continued)

(52) U.S. Cl.
  CPC ............. *H03L 7/085* (2013.01); *H03K 5/159* (2013.01); *H03L 7/081* (2013.01); *H03L 7/0991* (2013.01);
  (Continued)

(58) Field of Classification Search
  USPC .................................. 327/147–149, 156–158
  See application file for complete search history.

(56) References Cited

U.S. PATENT DOCUMENTS 5,014,231 A    5/1991  Reinhardt et al.
6,144,172 A *  11/2000 Sun .................... H05B 41/2928
                                                           315/209 R
(Continued)

FOREIGN PATENT DOCUMENTS

EP    2 194 646 A1    6/2010
EP    2 339 753 A1    6/2011
(Continued)

OTHER PUBLICATIONS

Tasca, Davide et al., "A 2.9-4.0-GHz Fractional-N Digital PLL With Bang-Bang Phase Detector and 560-fs rms Integrated Jitter at 4.5-mW Power", IEEE Journal of Solid-State Circuits, vol. 46, No. 12, Dec. 2011, pp. 2745-2758.

(Continued)

*Primary Examiner* — Adam Houston
(74) *Attorney, Agent, or Firm* — McDonnell Boehnen Hulbert & Berghoff LLP

(57) ABSTRACT

The disclosure provides a phase locked loop, PLL, for phase locking an output signal to a reference signal. The PLL comprises a reference path providing the reference signal to a first input of a phase detector, a feedback loop providing the output signal of the PLL as a feedback signal to a second input of the phase detector, a controllable oscillator generating the output signal based on at least a phase difference between reference and feedback signal, a digital-to-time converter, DTC, delaying a signal that is provided at one of the first and second input, a delay calculation path for calculating a DTC delay value. The PLL further comprises a randomization unit for generating and adding a random offset, i.e. a pseudo-random integer, to the delay value. The offset is such that a target output of the phase detector remains substantially unchanged.

14 Claims, 12 Drawing Sheets

(51) Int. Cl.
*H03K 5/159* (2006.01)
*H03L 7/099* (2006.01)
*H03L 7/081* (2006.01)
*H03L 7/197* (2006.01)
*H03K 5/00* (2006.01)

(52) U.S. Cl.
CPC ............ *H03L 7/197* (2013.01); *H03L 7/1976* (2013.01); *H03K 2005/00013* (2013.01); *H03L 2207/50* (2013.01)

(56) References Cited

U.S. PATENT DOCUMENTS

| | | | |
|---|---|---|---|
| 6,252,464 B1* | 6/2001 | Richards | H03C 3/0941 327/107 |
| 8,207,770 B1* | 6/2012 | Ravi | H03L 7/085 327/150 |
| 8,994,423 B2* | 3/2015 | Jenkins | H03L 7/087 327/149 |
| 9,041,444 B1* | 5/2015 | Tarighat Mehrabani | H03L 7/00 327/157 |
| 2003/0078016 A1* | 4/2003 | Groe | H04B 1/04 455/91 |
| 2003/0198311 A1 | 10/2003 | Song et al. | |
| 2004/0008265 A1* | 1/2004 | Pedigo | H04B 1/707 348/211.2 |
| 2004/0198363 A1* | 10/2004 | Zinn | H04B 1/7136 455/450 |
| 2005/0250464 A1* | 11/2005 | Spencer | H03C 3/0925 455/260 |
| 2006/0069707 A1* | 3/2006 | Gradishar | G06F 1/025 708/271 |
| 2008/0136532 A1 | 6/2008 | Hufford et al. | |
| 2013/0033293 A1* | 2/2013 | Zhang | H03L 7/1976 327/156 |
| 2017/0230889 A1* | 8/2017 | Zheng | H04W 40/005 |
| 2017/0346493 A1* | 11/2017 | Markulic | H03K 5/159 |

FOREIGN PATENT DOCUMENTS

| | | |
|---|---|---|
| GB | 2475663 B | 8/2012 |
| WO | 2010/024942 A2 | 3/2010 |

OTHER PUBLICATIONS

Raczkowski, Kuba et al., "A 9.2-12.7 GHz Wideband Fractional-N Subsampling PLL in 28 nm CMOS With 280 fs RMS Jitter", IEEE Journal of Solid-State Circuits, vol. 50, No. 5, May 2015, pp. 1203-1213.

Staszewski, Robert Bogdan et al., "Elimination of Spurious Noise Due to Time-to-Digital Converter", Cicuits and Systems Workshop, (DCAS), 2009, IEEE Dallas, Oct. 4-5, 2009, 4 pages.

* cited by examiner

DTC-BASED PLL AND METHOD FOR OPERATING THE DTC-BASED PLL

TECHNICAL FIELD

The present disclosure relates to a digital-to-time converter based phase locked loop and to a method for operating a phase locked loop.

CROSS REFERENCE TO RELATED APPLICATION

The present disclosure claims priority to European Patent Application No. 16171359.9, filed on May 25, 2016, the contents of which are herein incorporated by reference.

BACKGROUND

Digital-to-Time Converter 7 (DTC) based Phase Locked Loops 1 (PLLs) are gaining quickly in importance for LO frequency generation architectures. In context of digital and mixed signal ΔΣ PLLs 1, a DTC 7 can be used for realization of "true fractional dividers" as disclosed in D. Tasca, M. Zanuso, G. Marzin, S. S. C. Levantino and A. L. Lacaita, "A 2.9-4.0-GHz Fractional-N Digital PLL With Bang-Bang Phase Detector and 560-Integrated Jitter at 4.5-mW Power", in *JSSC*, 2011 for example. In this disclosure, a DTC 7 is used in the feedback loop 4, which feedback loop 4 also includes the voltage controlled oscillator 6 (VCO) in an analog PLL or the digitally controlled oscillator 6 (DCO) in a digital PLL, after the divider 12, as depicted in FIG. 1 which shows a fractional-N DTC based PLL. The DTC 7 serves to compensate for instantaneous errors made by the integer divider 12 during fractional frequency synthesis. Using a DTC 7 in the described manner (a similar effect can be obtained by putting a DTC 7 on the reference path 2) permits a narrower input operation range of the Phase/Frequency Detector 11 (PFD) in analog or the Time-to-Digital Converter (TDC) 11 in digital PLLs 1. Relaxing the PFD 11 and TDC 11 design requirements (e.g. power, resolution and linearity) results in a significant power/performance boost since these blocks typically form the bottleneck for the overall synthesizer quality.

Moreover, a DTC 7 proved to be very useful for realization of the fractional-N sub-sampling PLL 1 or divider-less all-digital PLL 1 (ADPLL) architectures as disclosed in K. Raczkowski et al., "A 9.2-12.7 GHz wideband fractional-N subsampling PLL in 28 nm CMOS with 280 fs RMS jitter", in *JSSC*, 2015 for example. In this disclosure, the DTC 7 is put on the reference path 2 as depicted in FIG. 2 which shows a fractional-N sub-sampling DTC based PLL. In FIG. 2, the DTC 7 produces controlled delays during the fractional synthesis to force sampling of the "VCO/DCO zero-crossings", i.e. to compensate for the accumulated fractional residue difference between the input and the output phase. In this architecture, a (typically power consuming) divider 12 becomes redundant, which highlights the importance of the DTC 7 even more.

However, the DTC-based PLL 1 has the disadvantage that the DTC 7 introduces quantization, mismatch and nonlinearity errors which negatively influences the PLL output spectral purity by increasing phase noise and spurious content.

A possible solution for this problem is given in R. B. Staszewski et al., "Elimination of spurious noise due to time-to-digital converter", in *Circuits and Systems Workshop (DCAS)*, Dallas, 2009. In this disclosure, a DTC is put on the reference path and it is fed with a random code stream. The DTC serves as a dithering element and increases the input quantization noise which naturally helps in covering the PLL spurious content, especially close to integer PLL multiplication numbers.

Likewise, EP-A-2 339 753 discloses a PLL having a DTC on the reference path with the DTC having an adjustable time delay. In order to take account of the quantization error of the adjustable time delay a dithering element is used during calibration of the PLL.

However, these solutions have the disadvantage that they increase the quantization errors in the system and thus still have a negative influence on the PLL output spectral purity.

SUMMARY OF THE DISCLOSURE

It is an aim of the present disclosure to provide a DTC-based phase locked loop having an improved PLL output spectral purity.

This aim is achieved according to the present disclosure with a phase locked loop showing the technical characteristics of the characterizing part of the first claim.

Therefore, the disclosure provides a phase locked loop for providing phase locking of an output signal to a reference signal. The phase locked loop comprises a phase detector provided for detecting a phase difference between a signal at a first input of the phase detector and a signal at a second input of the phase detector. The phase locked loop comprises a reference path for providing the reference signal the first input of the phase detector. The phase locked loop comprises a feedback loop for providing the output signal of the phase locked loop as a feedback signal to the second input of the phase detector. The phase locked loop comprises a controllable oscillator, such as a digitally controlled oscillator, DCO, or a voltage controlled oscillator, VCO, for generating the output signal based at least on the phase difference between the reference signal and the feedback signal detected by the phase detector, the output signal having a period. The phase locked loop comprises a digital-to-time converter, DTC, for delaying a signal that is provided at one of the first input and the second input of the phase detector. The phase locked loop comprises a delay calculation path in which a delay value for the DTC is calculated. The phase locked loop further comprises a randomization unit. The randomization unit is arranged for generating a random stream of offsets, which in the simplest form is a stream of pseudo-random numbers to represent a number of full periods of the VCO signal, and for adding this random offset stream in the delay calculation path. The delay calculation path is further arranged for calculating the delay value by scaling a sum of an initial delay value and the output stream of pseudo-random numbers with the period of the output signal such that the target output of the phase detector remains substantially unchanged.

Applying the randomized offset to the delay value, without thereby altering the target output, i.e. by adding a pseudo-random number of periods to the delay, offers the advantage that the DTC input is randomized such that its output remains substantially unchanged, but that the quantization noise introduced by the DTC is randomized, and such that the influence of potentially existing nonlinearities in the DTC transfer curve is randomized. This has the advantageous effect that the influence of DTC quantization, mismatch and nonlinearity errors on the PLL output spectral purity is greatly reduced.

In an embodiment of the phase locked loop according to the present disclosure the DTC is provided with a delay range covering a plurality of periods of the controllable oscillator. The random offset is generated for utilizing the full delay range of the DTC together with the calculated delay value.

The inventors have found that this embodiment offers a beneficial and easy means for providing a number of possibilities for a randomly generated offset and thus the delay value. Thereby, the randomly generated offset may be randomly selected from a series of possible offsets corresponding to one or more full period delays of the output signal coming from the controllable oscillator. Thereby, the full period delays assure that the output of the phase detector remains substantially unchanged.

In an embodiment of the phase locked loop according to the present disclosure the controllable oscillator is provided for generating a multi-phase output signal with a predetermined number $N_p$ of uniformly distributed phases. The randomization unit is provided for randomly, i.e. pseudo-randomly, selecting a phase of the output signal to be used as the feedback signal. The offset is generated corresponding to the randomly selected phase of the output signal. It thus no longer represents a complete period of the VCO signal, but a fraction of that according to the $N_p$ phases available from the VCO output. The number thus represents a delay of (K+S/Np) VCO periods, where K is the pseudo-random number, Np is the number of VCO phases, and S is a number [0 . . . Np−1] representing the selected phase of the multi-phase VCO signal. Preferably, the phase of the output signal is selected by means of a phase selection unit in the feedback loop, which phase selection unit is operatively connected to the randomization unit.

The inventors have found that this embodiment offers a beneficial and easy means for providing a number of possibilities for randomizing the offset and thus the delay value. Thereby, the randomly generated offset may be randomly selected from a series of possible offsets corresponding to the different phases of the output signal. Thereby, selecting the phase of the output signal of the controllable oscillator to be used as the feedback signal assures that the output of the phase detector remains substantially unchanged.

This embodiment may also be easily combined with the embodiment described above comprising the DTC having a delay range covering a plurality of periods for further increasing the number of possibilities for randomizing the offset and thus the delay value. This has the advantage that the influence of DTC quantization, mismatch and nonlinearity errors on the PLL output spectral purity may be further reduced.

In an embodiment of the phase locked loop according to the present disclosure the phase locked loop further comprises an integer divider for dividing the feedback signal by an integer N. The randomization unit is further provided for adding a differentiated offset to the integer N before division, wherein the differentiated offset is the difference between subsequently generated random offsets.

In an embodiment of the phase locked loop according to the present disclosure the DTC is arranged in the feedback loop.

In an embodiment of the phase locked loop according to the present disclosure the DTC is arranged on the reference path.

In an embodiment of the phase locked loop according to the present disclosure the output stream of pseudo-random numbers are integers representing an integer number of VCO periods.

The present disclosure further provides a method for operating a phase locked loop for providing phase locking of an output signal to a reference signal. The method comprises the steps of: detecting, by a phase detector, a phase difference between a signal at a first input of the phase detector and a signal at a second input of the phase detector, providing, by a reference path, the reference signal to the first input of the phase detector, providing, by a feedback loop, the output signal of the phase locked loop as a feedback signal to the second input of the phase detector, generating, by a controllable oscillator, such as a digitally controlled oscillator, DCO, or a voltage controlled oscillator, VCO, the output signal based at least on the phase difference between the reference signal and the feedback signal detected by the phase detector, the output signal having a period, delaying, by a digital-to-time converter, DTC, a signal that is provided at one of the first input and the second input of the phase detector, calculating, by a delay calculation path, a delay value for the DTC, generating, by a randomization unit, an output stream of pseudo-random offset, which in the simplest form is a stream of pseudo-random numbers to represent a number of full periods of the VCO signal, adding, by the randomization unit, the random offset in the delay calculation path, and calculating, in the delay calculation path, the delay value by scaling a sum of an initial delay value and the output stream of pseudo-random numbers with the period of the output signal such that the target output of the phase detector remains substantially unchanged.

For the discussion of the advantages of the method according to the present disclosure there is referred to the discussion of the advantages of the phase locked loop according to the present disclosure.

In an embodiment of the method according to the present disclosure the method further comprises: providing, by the DTC, a delay range covering a plurality of periods of the controllable oscillator. In the step of randomly generating the offset, the offset is generated for utilizing the full delay range of the DTC with the modified delay value.

In an embodiment of the method according to the present disclosure the method further comprises: generating, by the controllable oscillator, a multi-phase output signal. The method further comprises the step, performed by the randomization unit, of randomly, i.e. pseudo-randomly, generating the random offset, the generated offset corresponding to the randomly selected phase of the output signal. Preferably, the phase of the output signal is selected by means of a phase selection unit in the feedback loop.

In an embodiment of the method according to the present disclosure the phase locked loop further comprises an integer divider for dividing the feedback signal by an integer N. The method further comprises the step, performed by the randomization unit, of adding the random offset to the integer N before division.

BRIEF DESCRIPTION OF THE DRAWINGS

The disclosure will be further elucidated by means of the following description and the appended figures.

MODES FOR CARRYING OUT THE DISCLOSURE

Figure 1:
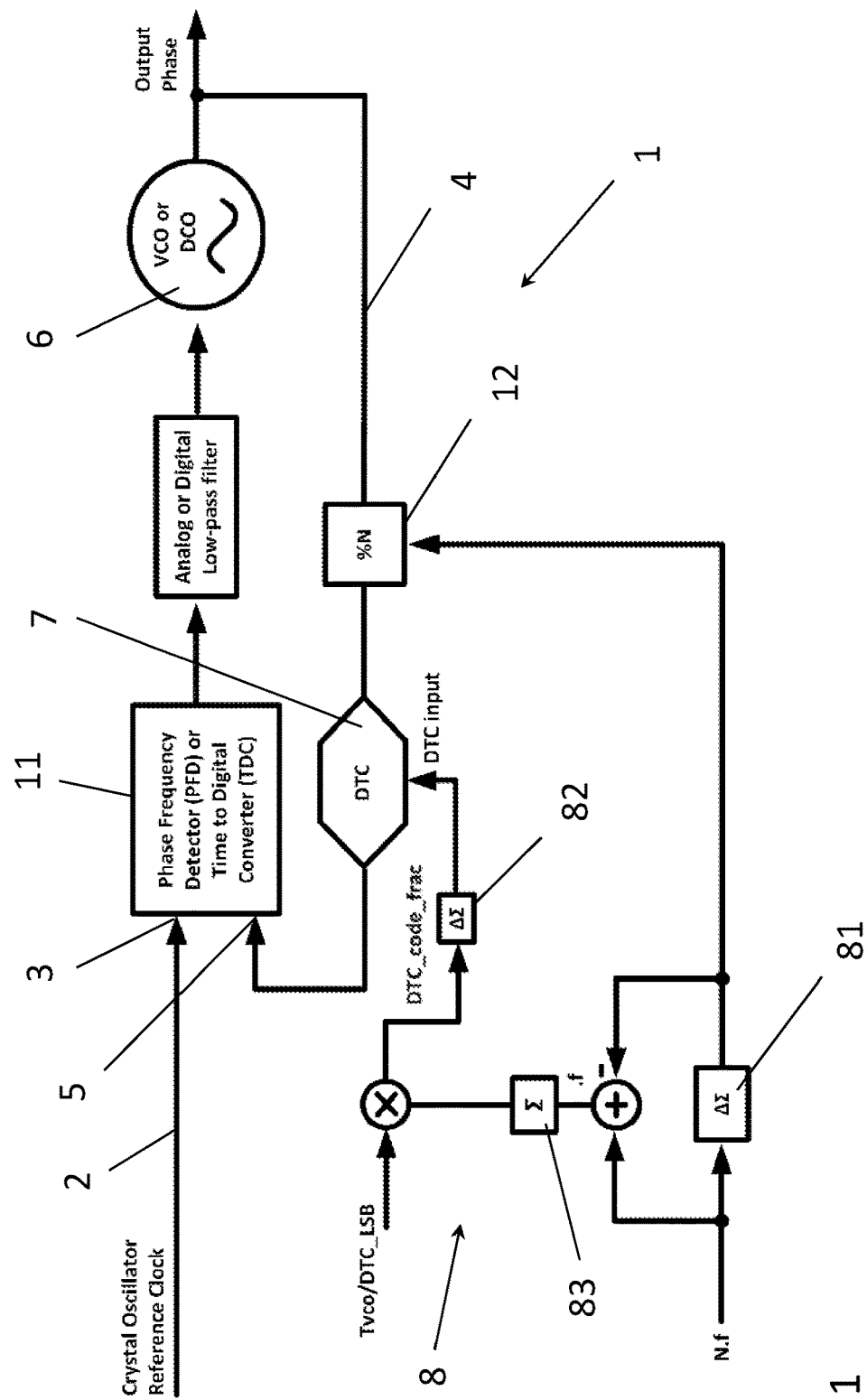
FIG. 1 shows a fractional-N DTC based PLL known from the prior art.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Figure 2:
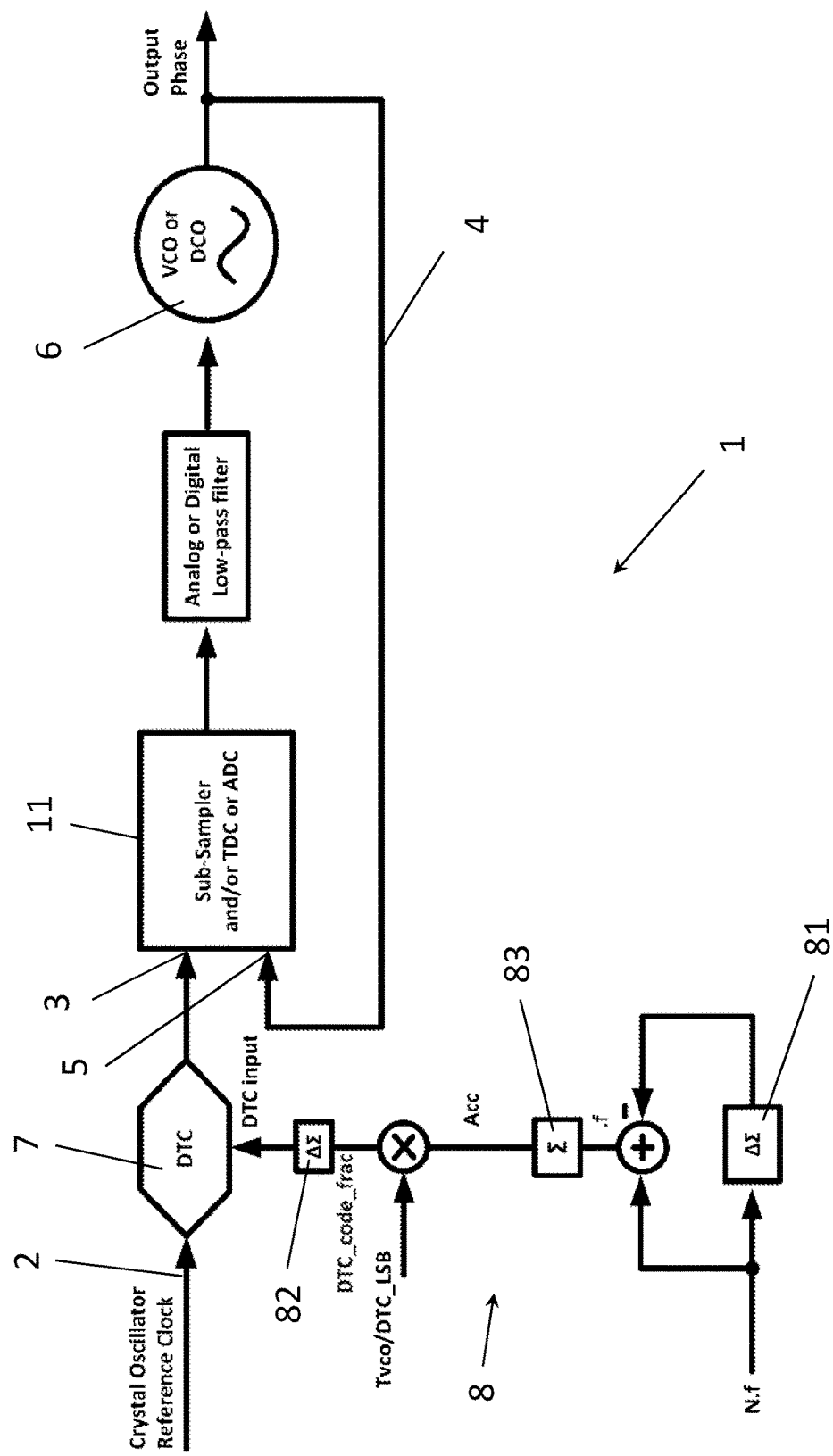
FIG. 2 shows a fractional-N sub-sampling DTC based PLL known from the prior art.

For a general description of the set-up of a PLL according to embodiments there is referred to description of the background art with respect to FIGS. 1 and 2.

Figure 3:
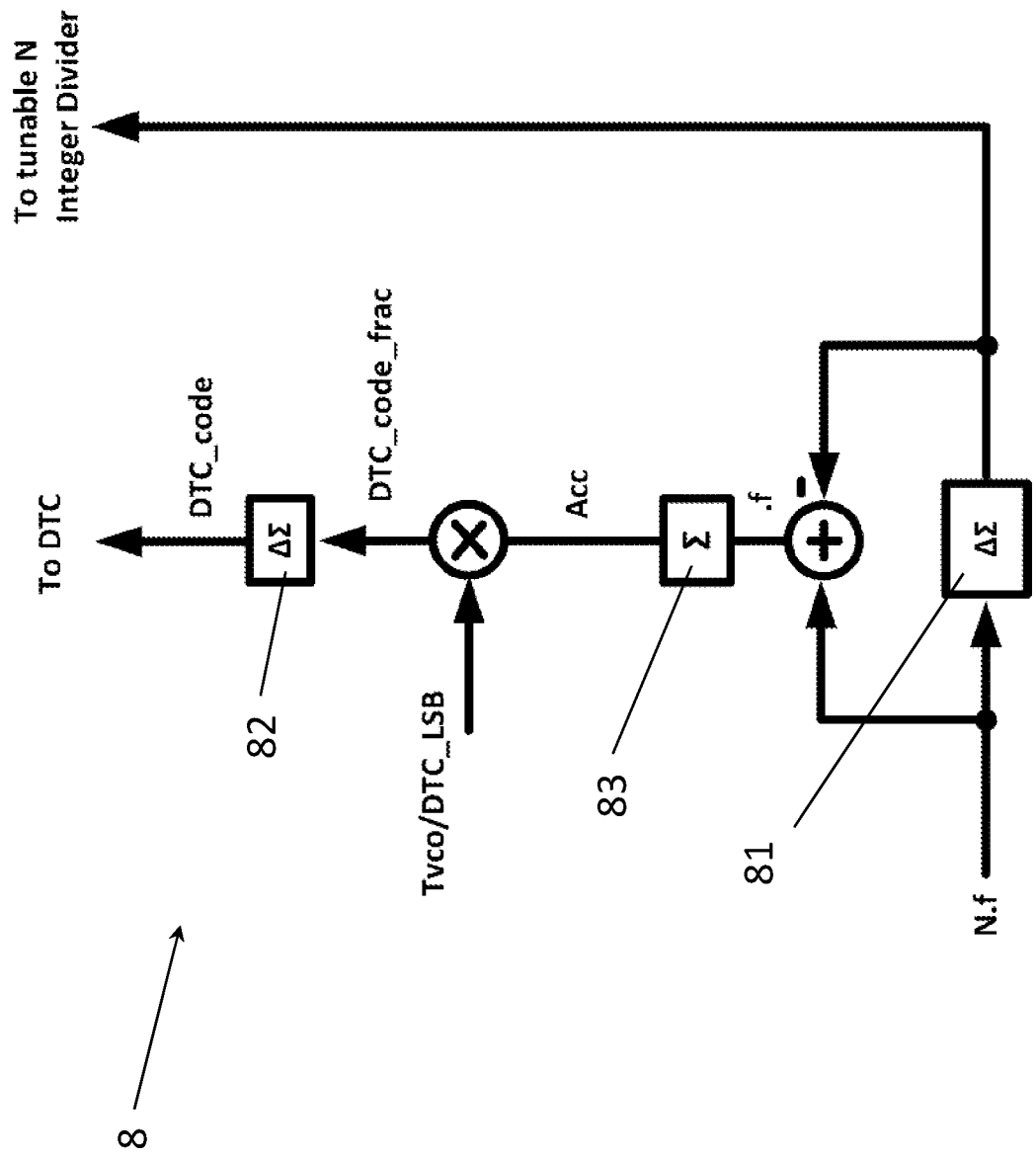
FIG. 3 shows a delay calculation path known from the prior art.

The DTC input code calculation chain or delay calculation path 8 in DTC based PLLs 1 typically looks as depicted in detail in FIG. 3 and as part of a PLL 1 in FIG. 1 or as part of a PLL 1 in FIG. 2. The PLL multiplication number N.f, where N stands for the integer and .f stands for the fractional part, is brought to a ΔΣ modulator 81 which produces a pseudo-random output dithered between different integer values, so that its output stream average is exactly N.f. This ΔΣ modulator 81 is typically of order one, which means that its output dithers between two consecutive integer values. For N.f=100.75, for example, the ΔΣ modulator 81 output will produce repeating sequences of the following four digits: 101, 101, 101 and 100.

The difference between the ΔΣ modulator 81 output and the N.f input is accumulated in every step in the accumulator block 83. The accumulated Acc value represents delay that the DTC 7 has to produce in the given clock cycle, expressed in the number of VCO/DCO periods, i.e. in unity intervals where one unit is a single VCO/DCO period (indicated by Tvco). Typically, the Acc value is less than a single VCO period as it represent the fractional part f. The Acc value is then scaled by Tvco/DTC_LSB giving the DTC_code_frac, which represents the exact delay that the DTC 7 has to produce expressed now in DTC least-significant bits (LSBs). This value has floating point accuracy and needs to be truncated to the available DTC input width. This can be done in various ways, e.g. by a truncation, by rounding or by an additional ΔΣ stage 82, which also shapes the associated quantization error.

For basic functionality, the DTC 7 needs to cover a single VCO/DCO period with some margin for possible analog inaccuracies. A DTC 7 of this type is reported in most of the today's DTC based PLLs 1.

Figure 4:
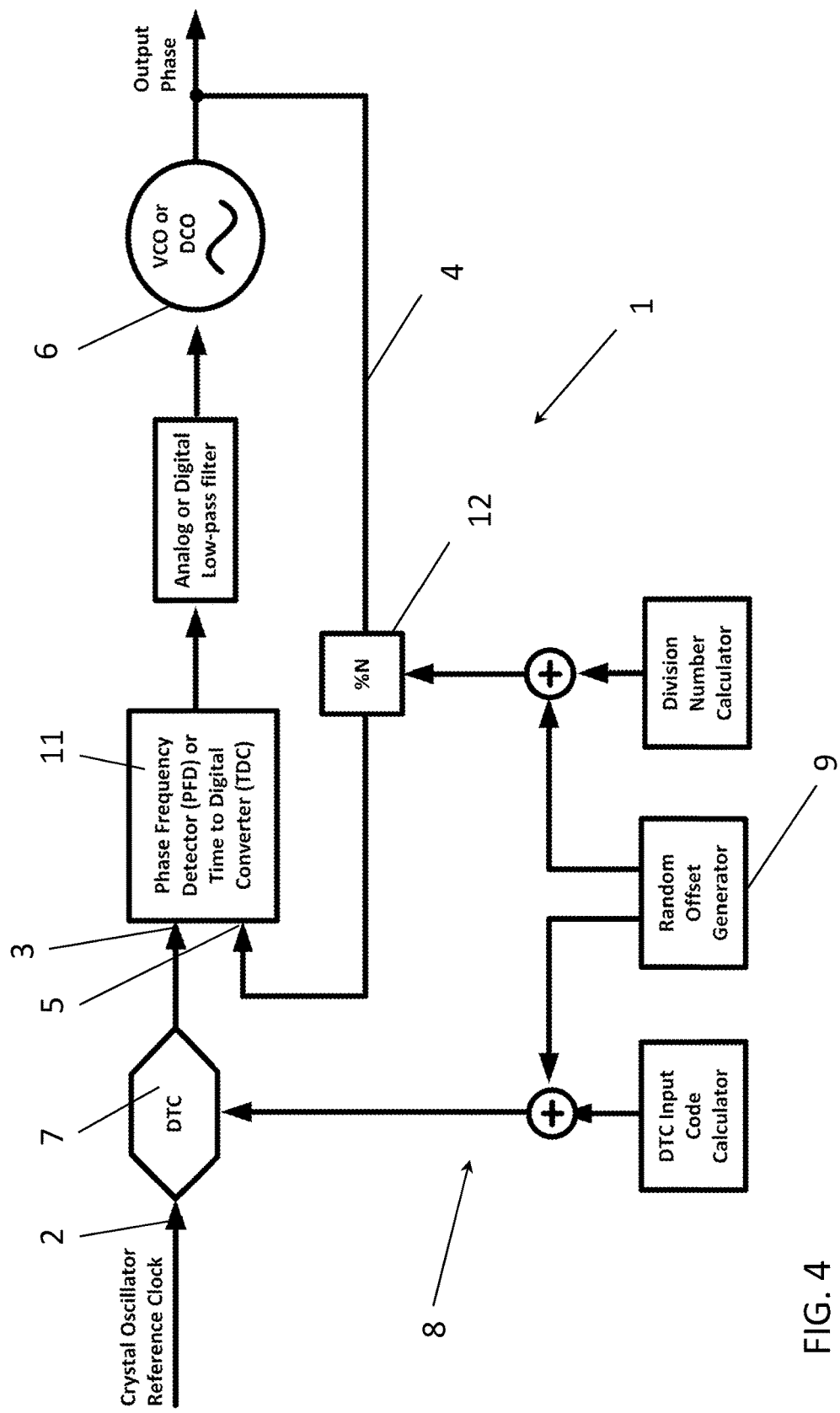
FIG. 4 shows a DTC based PLL according to an embodiment of the present disclosure.
Figure 5:
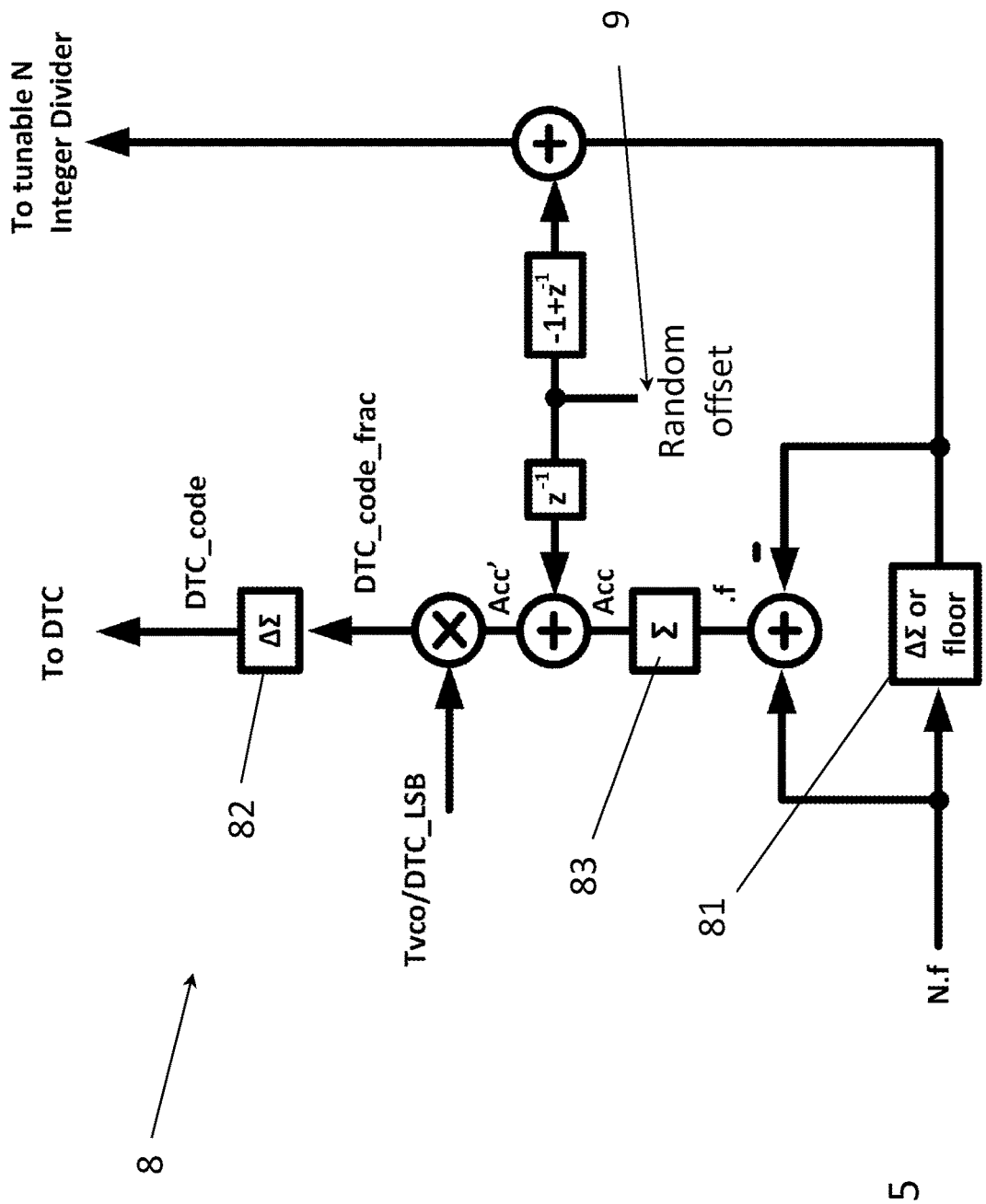
FIG. 5 shows an example of a delay calculation path and a randomization unit of the PLL of FIG. 4.

In the present disclosure, a DTC delay calculation method is disclosed which exploits a DTC 7 that can cover a plurality of VCO/DCO periods. The principle is depicted in FIGS. 4 and 5. The calculation of the Acc value remains the same as before. Alternatively, it can be obtained using a simple flooring, rounding or ceiling without the initial ΔΣ modulator. In the latter case it is useful to have an overflowing accumulator (for Acc value producing) with the integer range limitation set by the maximum DTC delay expressed in VCO/DCO periods, to avoid clipping.

The fundamental idea is to add, as an offset, a pseudo-random stream of numbers K.Tvco (K=1, 2, 3, . . . , where K is an arbitrary integer number and Tvco the VCO period) to the delay value, i.e. the initial Acc value, calculated in the delay calculation path 8, as can be seen in FIG. 5. Adding this pseudo-random stream of offsets modifies the Acc value to the Acc' value. After having determined the Acc' value, this value is treated in the same way as the Acc value in the delay calculation path 8 of the prior art, i.e. the Acc' value is scaled by Tvco/DTC_LSB giving the DTC_code_frac as illustrated in FIG. 5.

By adding the pseudo-random stream of numbers K to the offset, it is clear that the DTC_code_frac consists of two parts, i.e. a first part resulting from the initial Acc value and a second part resulting from the pseudo-random number of VCO periods. Because K is an integer, the second part of the DTC_code_frac represents K times Tvco/DTC_LSB, i.e. it represents a delay that corresponds to K times the VCO/DCO period. Therefore, due to the pseudo-random numbers, the phase detector 11 (e.g. the PFD or the TDC) will target an equivalent VCO/DCO zero-crossing that is K periods after the current VCO/DCO zero-crossing. In other words, adding the pseudo-random integer K to the delay value Acc does not substantially influence the target output of the phase detector 11. As such, the target output of the phase detector 11 remains substantially unchanged.

According to the present disclosure, a randomization unit 9 is added to the PLL 1, which randomization unit 9 is provided for generating the offset, i.e. generating the pseudo-random number, and for adding the offset to the delay calculation value Acc resulting in the modified delay calculation value Acc'. In an embodiment, the pseudo-random number may be generated in the randomization unit 9 by a plurality of linear feedback shift registers.

Figure 6:
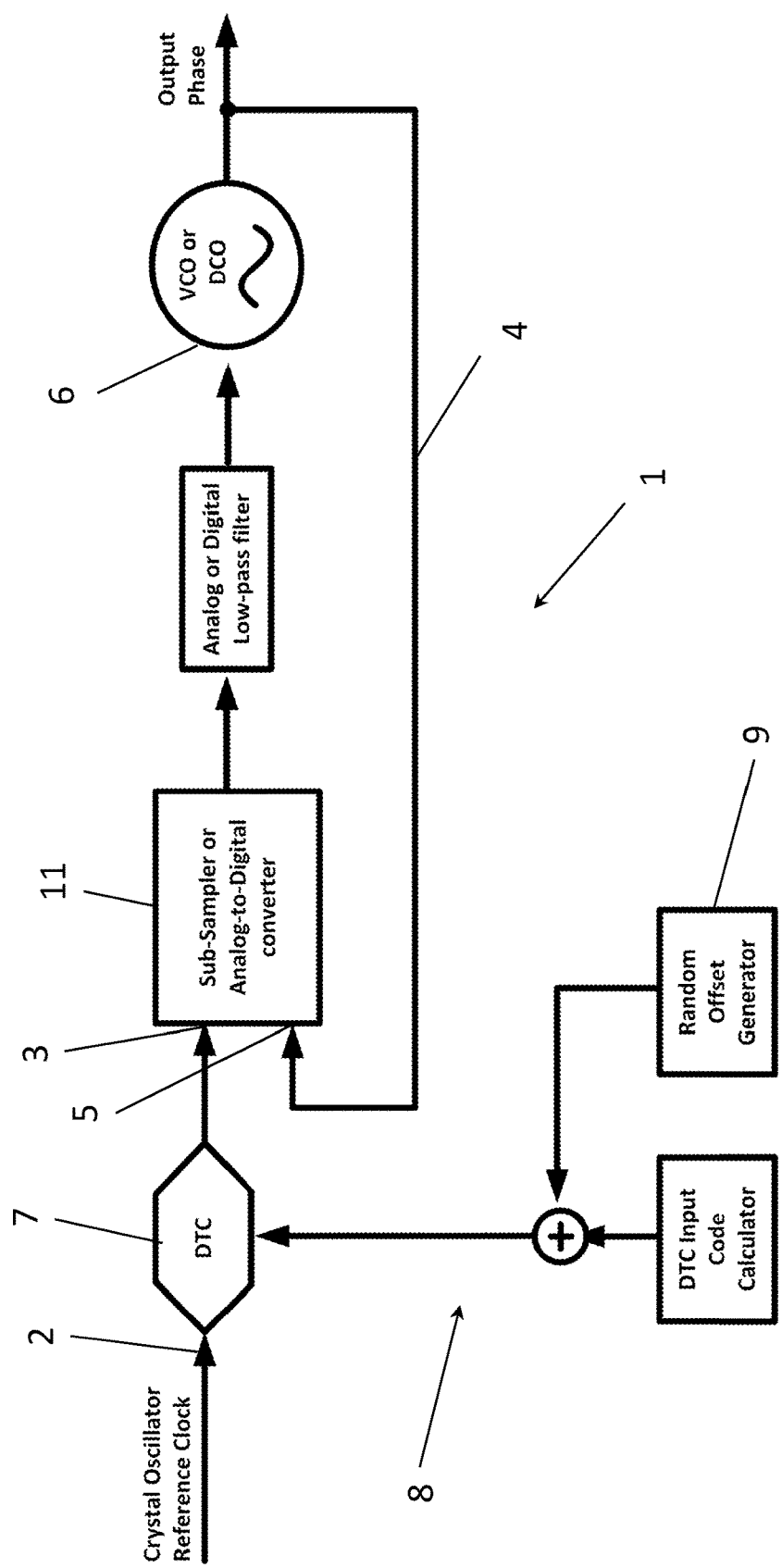
FIG. 6 shows a DTC based PLL according to an embodiment of the present disclosure.
Figure 7:
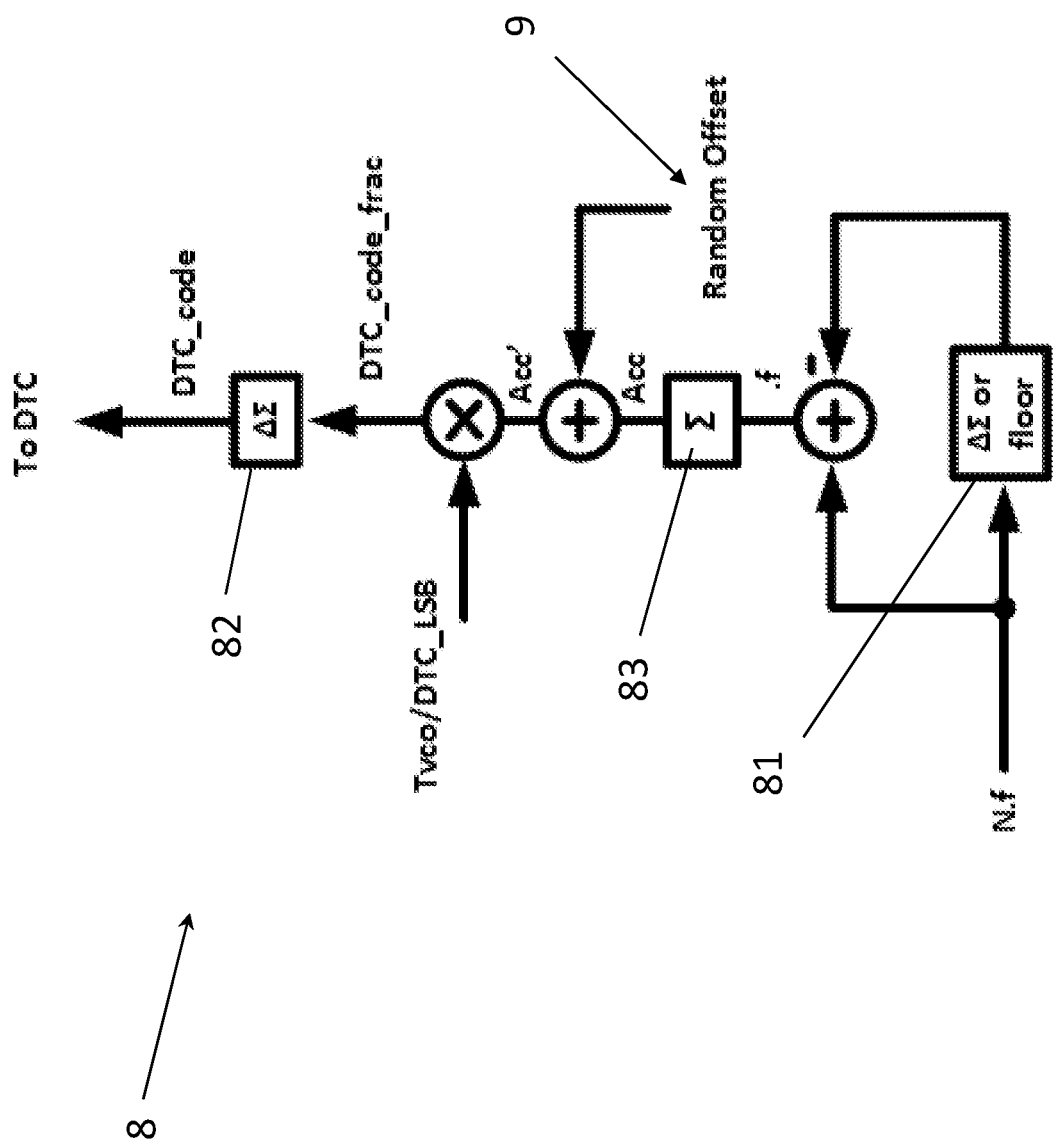
FIG. 7 shows an example of a delay calculation path and a randomization unit of the PLL of FIG. 6.

By adding a pseudo-random delay K.Tvco (K=1, 2, 3, . . . , where K is an arbitrary integer number) as the offset, the following effects are observed: the divider 12 instantaneously lets K VCO/DCO periods through to its output, which has to be compensated by a larger DTC delay. Therefore, the DTC 7 has to produce the regular fractional residue compensation plus the random integer (i.e. K VCO/DCO periods) compensation, to effectively realize the wanted frequency division, i.e. to ensure that the phase detector 11 samples the integer-N part equivalent VCO/DCO zero-crossings. Similarly, in case of a divider-less, sub-sampling based PLL 1, such as shown in FIGS. 6 and 7, the addition of a pseudo-random number K as the offset results in sampling of the integer-N part equivalent VCO/DCO zero-crossings.

For example, the instantaneous Acc value could be 0.d (where 0.d is a fractional value in the range of [0:1]), which represents the originally asked DTC delay in Tvco unity intervals (i.e. 0.d*Tvco). After the random integer addition, Acc'=K+0.d, the asked delay contains the equivalent fractional residue with a randomized integer part K.

Notably, after scaling by TVCO/DTC_LSB, the addition of the randomized integer part K results in the production of a random DTC_code_frac value and, hence, in a potentially randomized DTC quantization error induced by an appropriate $\Delta\Sigma$ 82 or a similar rounding in the following stage. Additionally, the full DTC operation range or delay range, covering multiple VCO/DCO periods, is exploited. It is proposed to use different DTC codes to obtain the same frequency division effect on average. This induces randomization of the nonlinearity, such as differential nonlinearity (DNL) and integral nonlinearity (INL) in the DTC transfer curve, as explained below.

Figure 8:
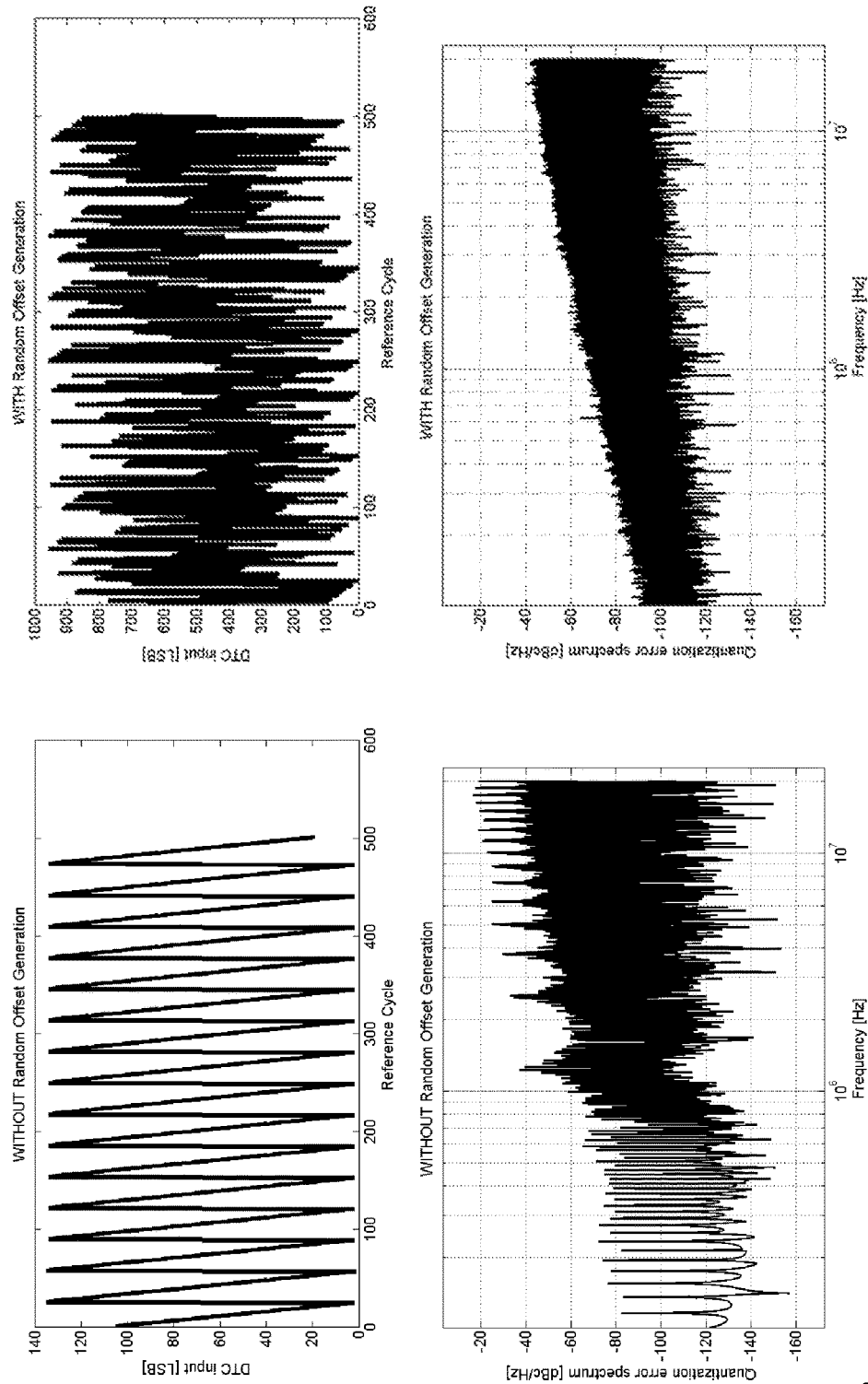
FIG. 8 shows DTC delay values and quantization error of a PLL according to an embodiment of the present disclosure without and with randomized offset.

The proposed delay randomization has been performed for a 10-bit DTC 7 with 0.7 ps LSB. The multiplication number of the PLL 1 has been chosen as N.f=(250+$2^{-5}$) and the reference frequency ($F_{ref}$) is 40 MHz. The DTC 7 can, hence, cover up to 7*Tvco of delay. Therefore, in some embodiments, the pseudo-random integer may be in the range of [0:7]. It should be remarked that also a smaller range (e.g. [0:5]) may be chosen for the pseudo-random integer, but that a better randomization may be achieved with a larger range. FIG. 8 (top row) shows output of the DTC delay calculation path 8 from FIG. 5 for the offset addition OFF (left) and ON (right). Without the offset addition, the DTC input is a pseudo-periodic triangular wave for fractional residue compensation. By turning the offset addition on several effects are achieved: (1) the DTC input is randomized, (2) the quantization noise introduced by the DTC 7 is randomized and (3) the influence of potentially existing nonlinearities in the DTC transfer curve is randomized. FIG. 8 (bottom row) shows DTC quantization signal spectrum for the offset addition turned OFF (left) and ON (right). It can be noted that without the proposed randomization, there is a significant amount of energy stored at the multiples of the fractional residue frequency, i.e. at $N*2^{-5}*F_{ref}$. This effect is completely removed after enabling the randomization. The proposed randomization in principle removes periodicity from the quantization signal, which now contains only quantization noise. The shaping comes from an optional $\Delta\Sigma$ modulator 82 at the output.

Figure 9:
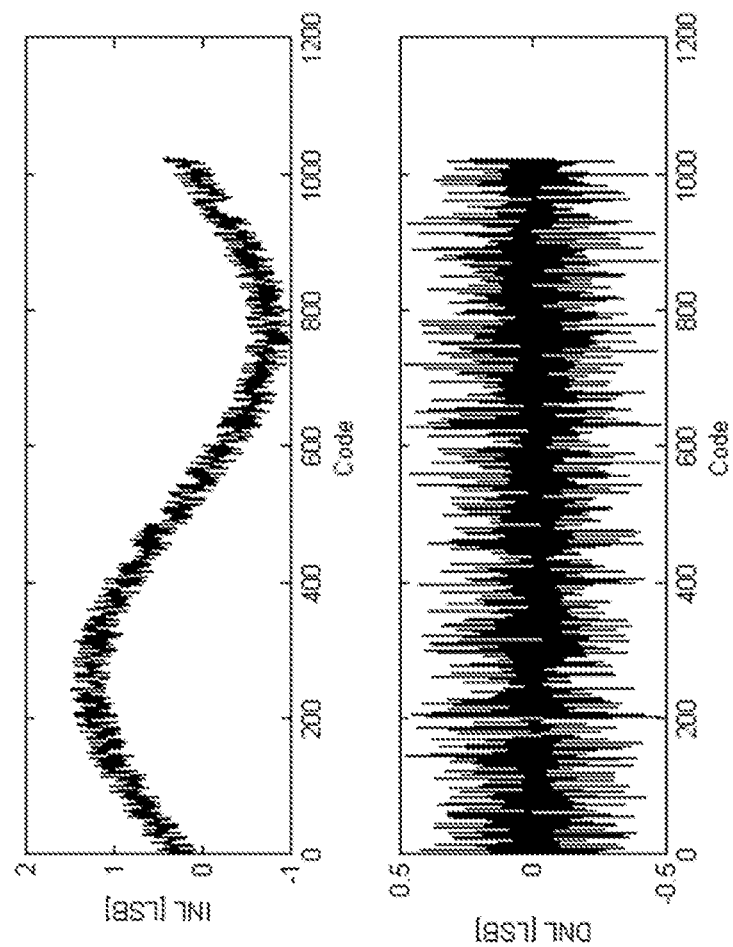
FIG. 9 shows DTC nonlinearity for a PLL according to an embodiment of the present disclosure.

Additionally, we introduce nonlinearity in the DTC 7 as depicted in FIG. 9. A nonlinear DTC 7, in context of a PLL 1 where the DTC 7 is used in the phase-error detection path, can introduce noise-folding and spurs. Two tests have been performed in a complete PLL environment. We highlight the influence of the offset addition in the DTC delay calculation path 8.

Figure 10:
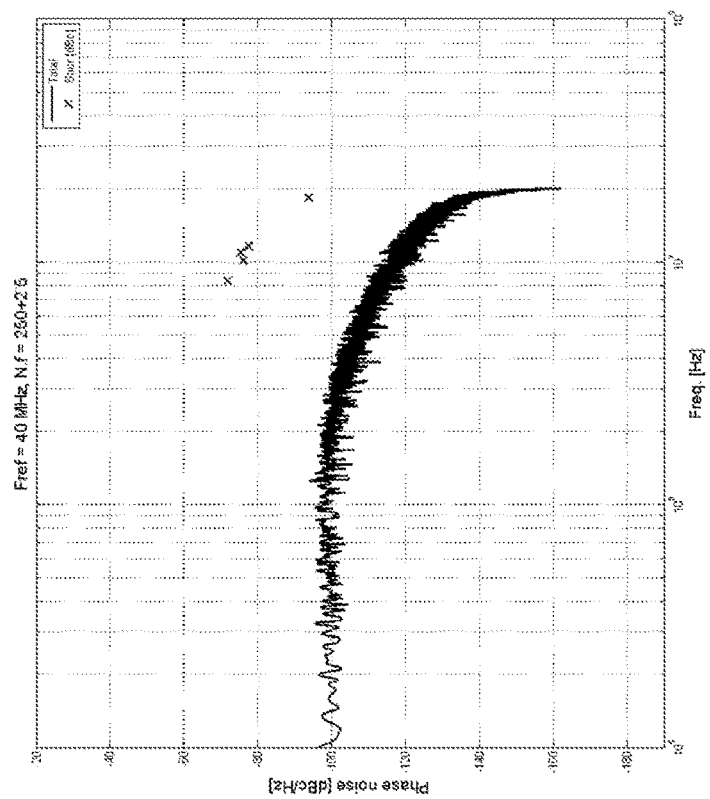
FIG. 10 compares the output spectrum of a PLL according to an embodiment of the present disclosure with and without the addition of the randomized offset.
Figure 10:
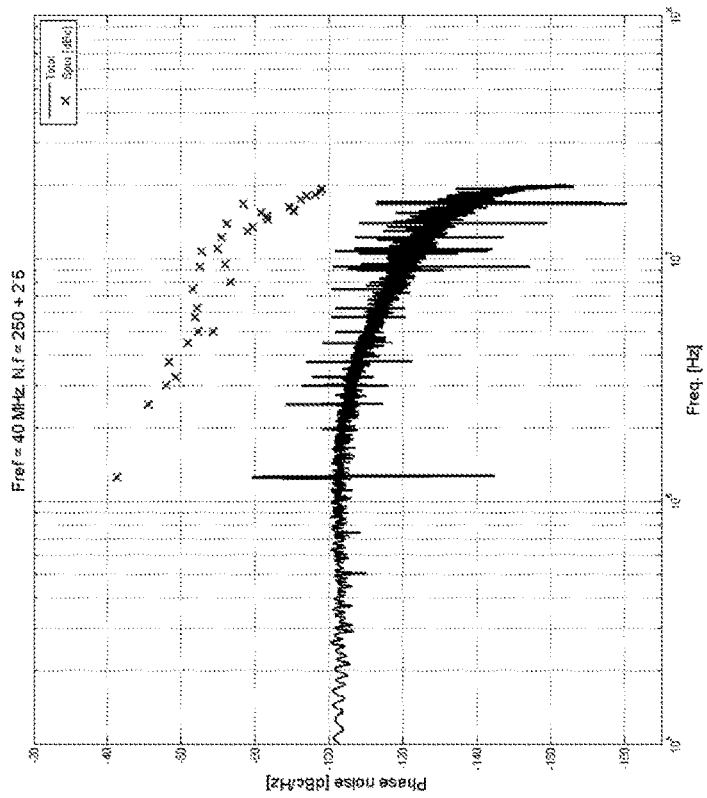

FIG. 10 (left) shows the PLL output spectrum when the randomization of the DTC output is turned off. The fractional spur, located at $2^{-5}*40$ MHz, is rather pronounced because of DTC INL/DNL. After switching the randomization on the spurious content at the PLL output is reduced, as seen in FIG. 10 (right). Importantly, the introduced randomization can increase noise in the PLL system 1, as can be seen from the in-band phase noise increase in FIG. 10 (right). This however only happens in context of a nonlinear DTC 7, i.e. the method itself does not increase the quantization noise.

Finally, the proposed randomization also pushes the DTC supply variations to high frequencies, which are then easily filtered by the PLL 1.

Figure 11:
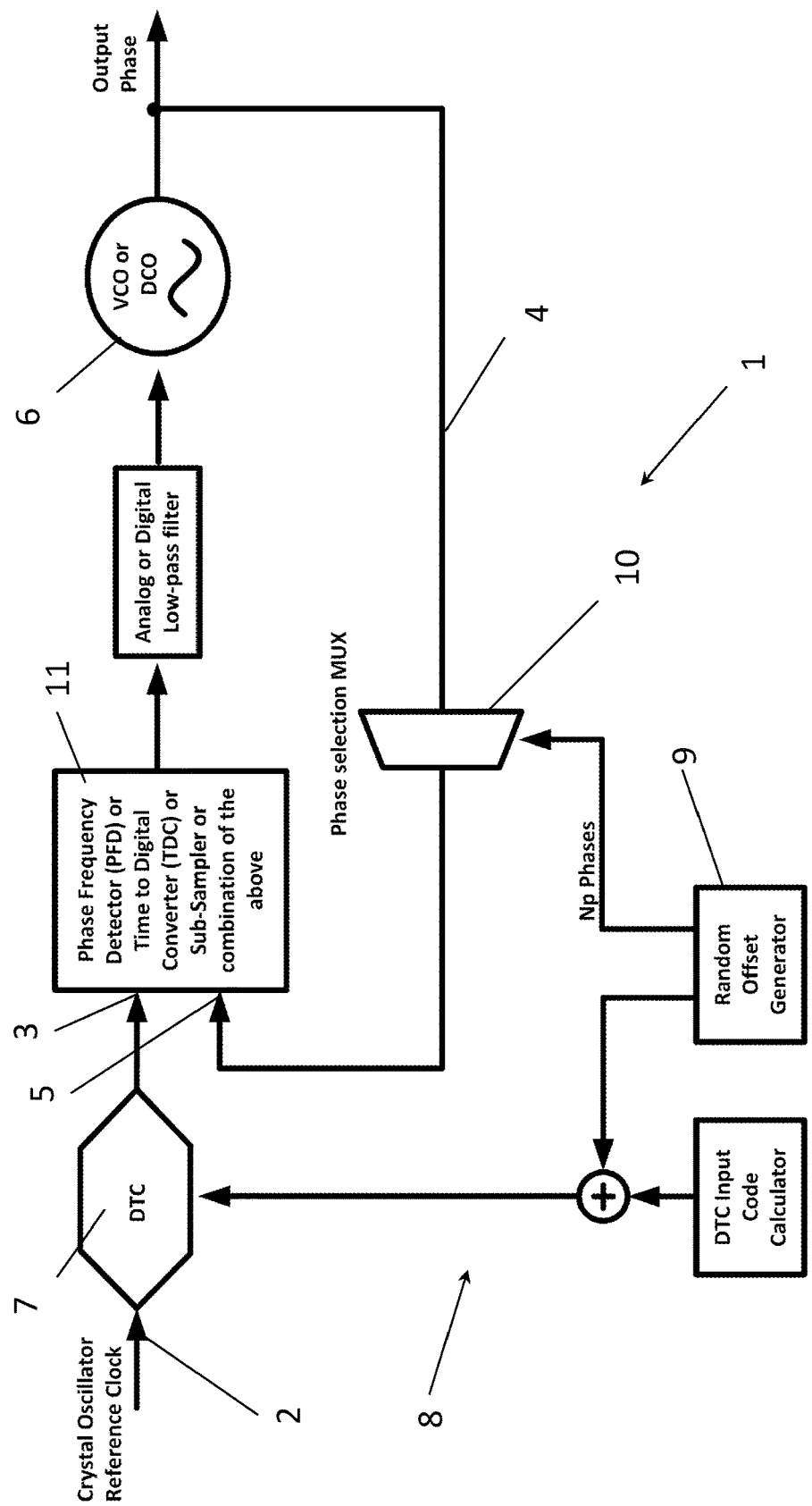
FIG. 11 shows a PLL according to an embodiment of the present disclosure.

To have sufficient randomization seeds (i.e. enough possible values out of which to pick the pseudo-random integer K), the DTC 7 may require a very long delay range, which might introduce other non-idealities, such as larger area, phase noise degradation, larger supply perturbation, etc. The inventors have however found that when a VCO/DCO 6 is used which has a multi-phase output, multi-phase selection can be applied to increase the number of the randomization seeds without increasing the delay range of the DTC 7, as for example illustrated in FIG. 11. It should be remarked that the multi-phase selection technique, as described here, may also be used independently from the technique described above utilizing the DTC 7 covering a plurality of VCO/DCO periods.

Figure 12:
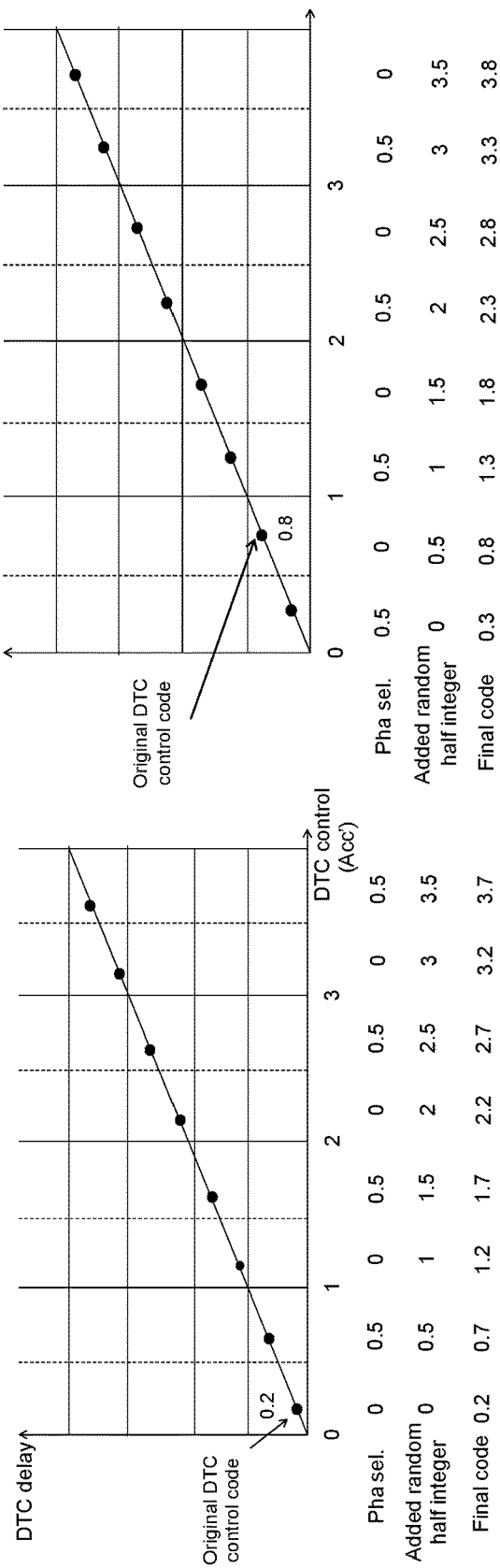
FIG. 12 shows an example of offset addition and phase selection in a PLL according to an embodiment of the present disclosure.

Typically VCOs/DCOs 6 already have differential outputs so differential phase selection can be easily implemented by adding a phase selection unit 10, such as a simple multiplexer or a phase selector, at the output of the VCO/DCO 6. With the assistance of the differential phase selection by the randomization unit 9 via the phase selection unit 10, the addition of an offset of a random full integer K can be changed to the addition of an offset of a random half integer. The offset thus no longer represents a complete period of the VCO signal, but a fraction of that according to the $N_p$ phases available from the VCO output. The pseudo-random offset thus represents a delay of (K+S/Np) VCO periods, where K is the pseudo-random integer, Np is the number of VCO phases, and S is a number [0, . . . , Np−1] representing the selected phase of the multiphase VCO signal. This is for example illustrated in FIG. 12 for two different initial DTC delay values or control codes, where the possible random integer, the corresponding phase selection and the final delay values are shown for each of the two different initial delay values. Note the random number can be even smaller than half integer if more phases are available at the output of the VCO/DCO 6. The described effects in terms of randomization are then even more pronounced by adding very little analog hardware, e.g. differential phase selection by the DTC or divider, or in context of divider-free architectures (such as sub-sampling PLLs for example) a phase/frequency detector with tunable sign (sub-sampling of the half VCO/DCO period zero crossing changes the phase error detector sign in this architecture).

Experimental results show that the fractional spur level can be reduced from −38 dB without integer randomization to −47 dB with full integer randomization and to −50 dB with half integer randomization.

The phase error during multi-phase selection from a multi-phase VCO/DCO 6 also introduces a periodic pattern which might also lead to fractional spurs. The differential phase error can be contributed from signal clipping in the VCO/DCO 6, or delay mismatches in the phase selector, etc. The differential phase error can be suppressed by the proposed randomization technique, since the randomization also applies to the phase selection.

Experimental results show that even with a large phase error of 15 degree, the RMS jitter only degrades from 3.4 ps to 3.55 ps, and the fractional spur level remain almost unchanged.

The invention claimed is:

1. A phase locked loop for providing phase locking of an output signal to a reference signal, the phase locked loop comprising:
a phase detector configured for detecting a phase difference between a signal at a first input and a signal at a second input,
a reference path configured for providing the reference signal to the first input of the phase detector,
a feedback loop configured for providing the output signal of the phase locked loop as a feedback signal to the second input of the phase detector,
a controllable oscillator configured for generating the output signal based at least on the phase difference between the reference signal and the feedback signal detected by the phase detector, the output signal having a period,
a digital-to-time converter, DTC, configured for delaying a signal that is provided at one of the first input and the second input of the phase detector, and
a randomization unit configured for:
generating an output stream of pseudo-random numbers, wherein the output stream of pseudo-random numbers are integers representing an integer number of VCO periods, and
adding the output stream of pseudo-random numbers to a delay calculation path, the delay calculation path being configured for calculating a delay value for the DTC by scaling a sum of an initial delay value and the output stream of pseudo-random numbers with the period of the output signal such that a target output of the phase detector remains substantially unchanged.

2. The phase locked loop according to claim 1, wherein the DTC is provided with a delay range covering a plurality of periods of the controllable oscillator, the output stream of pseudo-random numbers being generated for utilizing the full delay range of the DTC together with the calculated delay value.

3. The phase locked loop according to claim 1, wherein the controllable oscillator is configured for generating a multi-phase output signal, and, the randomization unit is configured for randomly selecting a phase of the output signal to be used as the feedback signal.

4. The phase locked loop according to claim 1, wherein the phase locked loop further comprises an integer divider for dividing the feedback signal by an integer N, the randomization unit being further configured for adding a differentiated offset to the integer N before division, the differentiated offset being a difference between subsequently generated pseudo-random numbers.

5. The phase locked loop according to claim 1, wherein the DTC is arranged in the feedback loop.

6. The phase locked loop according to claim 1, wherein the DTC is arranged on the reference path.

7. The phase locked loop according to claim 3, wherein the DTC is arranged in the feedback loop.

8. The phase locked loop according to claim 3, wherein the DTC is arranged on the reference path.

9. A method for operating a phase locked loop for providing phase locking of an output signal to a reference signal, the method comprising the steps of:
detecting, by a phase detector, a phase difference between a signal at a first input and a signal at a second input,
providing, by a reference path, the reference signal to the first input of the phase detector,
providing, by a feedback loop, the output signal of the phase locked loop as a feedback signal to the second input of the phase detector,
generating, by a controllable oscillator, the output signal based at least on the phase difference between the reference signal and the feedback signal detected by the phase detector, the output signal having a period,
delaying, by a digital-to-time converter, DTC, a signal that is provided at one of the first input and the second input of the phase detector,
generating, by a randomization unit, an output stream of pseudo-random numbers, wherein the output stream of pseudo-random numbers are integers representing an integer number of VCO periods,
adding, by the randomization unit, the output stream of pseudo-random numbers in a delay calculation path, and
calculating, in the delay calculation path, a delay value for the DTC by scaling a sum of an initial delay value and the output stream of pseudo-random numbers with the period of the output signal such that a target output of the phase detector remains substantially unchanged.

10. The method according to claim 9, wherein the method further comprises the step of:
providing, by the DTC, a delay range covering a plurality of periods of the controllable oscillator,
and wherein the step of generating the output stream of pseudo-random numbers comprises: generating the pseudo-random numbers for utilizing the full delay range of the DTC.

11. The method according to claim 9, wherein the method further comprises the step of:
generating, by the controllable oscillator, a multi-phase output signal, and
generating the output stream of pseudo-random numbers according to a randomly selected phase of the output signal.

12. The method according to claim 9, wherein the method further comprises the steps of:
generating, by the controllable oscillator, a multi-phase output signal, and
randomly selecting, by the randomization unit, a phase of the output signal to be used as the feedback signal.

13. The method according to claim 9, wherein the phase locked loop further comprises an integer divider for dividing the feedback signal by an integer N, the method further comprising the step of: adding, by the randomization unit, a differentiated offset to the integer N before division, the differentiated offset being a difference between subsequently generated pseudo-random numbers.

14. The method according to claim 10, wherein the phase locked loop further comprises an integer divider for dividing the feedback signal by an integer N, the method further comprising the step of: adding, by the randomization unit, a differentiated offset to the integer N before division, the differentiated offset being a difference between subsequently generated pseudo-random numbers.

* * * * *